United States Patent

Sasaki et al.

[11] Patent Number: 5,846,851
[45] Date of Patent: Dec. 8, 1998

[54] METHOD OF APPLYING ADHESIVE TO LEAD OF LEAD FRAME AND METHOD OF MAKING SEMICONDUCTOR DEVICE USING THE SAME

[75] Inventors: Toshi Sasaki; Teruyuki Watahiki; Hiroki Tanaka; Takaharu Yonemoto; Takashi Suzumura, all of Ibaraki-ken, Japan

[73] Assignee: Hitachi Cable, Ltd., Tokyo, Japan

[21] Appl. No.: 740,530

[22] Filed: Oct. 30, 1996

[30] Foreign Application Priority Data

Oct. 31, 1995 [JP] Japan ................................. 7-282827

[51] Int. Cl.⁶ .................................................. H01L 21/60
[52] U.S. Cl. ............................................ 438/118; 438/119
[58] Field of Search ................................ 437/209, 210, 437/211, 212, 213, 214, 215, 216, 217, 218, 219, 220; 438/118, 119, 612, 613

[56] References Cited

U.S. PATENT DOCUMENTS

| | | | |
|---|---|---|---|
| 5,403,785 | 4/1995 | Arai et al. | 437/220 |
| 5,438,020 | 8/1995 | Grancher et al. | 437/204 |
| 5,455,200 | 10/1995 | Bigler et al. | 437/220 |

FOREIGN PATENT DOCUMENTS

| | | |
|---|---|---|
| 6-61280 | 3/1994 | Japan . |
| 6-69258 | 3/1994 | Japan . |

*Primary Examiner*—Kevin Picardat
*Attorney, Agent, or Firm*—McDermott, Will & Emery

[57] ABSTRACT

A method of applying adhesives to leads of lead frame, a nozzle of a dispenser is moved horizontally above one lead and positioned against the lead at a predetermined distance. While keeping adhesives flowing from the nozzle of the dispenser, the dispenser is moved horizontally relative to the leads in a direction from one lead to the next lead so that the distance is kept constant. Then the adhesives are applied to a predetermined portion of each lead. When the application of adhesives to the last lead is complete, the nozzle is raised and moved horizontally. Therefore, the number of upward and downward movements of the nozzle is greatly reduced and the application time can be shortened. Preferably, the distance between the tip of the nozzle and the surface of the lead is to be one-fourth to three times as long as the inside diameter of the nozzle.

6 Claims, 5 Drawing Sheets

METHOD OF APPLYING ADHESIVE TO LEAD OF LEAD FRAME AND METHOD OF MAKING SEMICONDUCTOR DEVICE USING THE SAME

BACKGROUND OF THE INVENTION

This invention relates to a method of applying adhesive to leads of a lead frame and a method of making a semiconductor device having a semiconductor chip using the same, and more particularly to, a method of applying adhesives to leads of a lead frame, through which the semiconductor chip is to be attached to the leads.

In order to attach a semiconductor chip like IC or LSI chip to leads of a lead frame, a conventional method, which comprises the steps of providing an insulating film like a polyimide film on both sides of which an insulating adhesive layers are provided, respectively, sticking one side of the insulating film to leads of the lead frame, and mounting the semiconductor chip to the other side of the insulating film, has been put into practice. Typical lead frame structures using such a method are known as COL (Chip on Lead) and LOC (Lead on Chip). In the conventional method, insulating films having adhesive layers on both sides thereof are cut or punched out by a punching machine into a certain shape like a strip, and stuck to the leads of the lead frame.

In the conventional method of sticking an insulating film to leads of a lead frame, however, there is a disadvantage in that a fabrication cost becomes high, because it needs a larger amount of expensive insulating films like polyimide films.

Typically, after sticking the insulating film to the leads of the lead frame, the semiconductor chip is mounted on the leads through the insulating film, and then leads are electrically connected to corresponding terminals formed on the semiconductor chip, respectively. After that, the leads and the semiconductor chip are packaged by a resin, and a semiconductor device is obtained. Therefore, there is another disadvantage in that the insulating film may cause a crack into the package of the semiconductor device, because the film such as a polyimide film may absorb moisture to be expanded inside the package.

In order to avoid such disadvantages, another conventional method comprising the steps of applying adhesives to leads of a lead frame, and attaching a semiconductor chip to the leads by the adhesives has been proposed. In the conventional method, an apparatus having a combination of an X-Y robot and a dispenser is generally used. The X-Y robot can move the dispenser in both X and Y directions, whereby adhesives are applied to predetermined portions of the leads of the lead frame, i.e. a tip of each lead and a bus-bar, by the dispenser. Especially, in applying the adhesive to the tip of each lead, point-to-point applying process is used. This conventional method comprises the steps of moving a nozzle of the dispenser horizontally so that the nozzle thereof is above one of the leads of the lead frame, lowering the nozzle and halting at a predetermined distance from the surface of the leads, flowing an adhesive from the nozzle for a predetermined time, applying the adhesive to the lead of the lead frame, raising the nozzle of the dispenser at a predetermined distance, and moving the nozzle of the dispenser horizontally to the next lead. The lowering, flowing, applying, raising and moving processes are repeated certain times in accordance with the number of leads where adhesives are applied. In order to implement this conventional method explained above, applying apparatuses, for example, disclosed in Japanese Published Patent Application no. 6-61280 (an apparatus for applying adhesives to semiconductor chip thinly and uniformly), and Japanese Published Patent Application no. 6-69258 (silver paste supplying unit having a screen, the screen being provided with rectangular holes in a mesh-shape having a variety of sizes, so that the silver paste is stably supplied to an island of a lead frame, neither depending on the size of a semiconductor chip nor increasing the number of steps of the process) are known to public.

In the latter conventional method of applying adhesives to leads of a lead frame, however, there is a disadvantage in that it takes about ten times as long as it takes in the former conventional method of sticking an insulating film to leads of a lead frame, because at each time the adhesives are applied to each lead of the lead frame, the nozzle of the dispenser needs to be lowered, raised and moved horizontally.

SUMMARY OF THE INVENTION

Accordingly, it is an object of the invention to provide a method of applying adhesives to leads of a lead frame by which an adhesive-applying time can be shortened.

It is further object of the invention to provide a method of making a semiconductor device by which its cost can be decreased.

According to the first feature of the invention, a method of applying an adhesive to a plurality of leads of a lead frame, comprises the steps of:

positioning an opening of a dispenser against one of the leads at a predetermined distance;

keeping the adhesive flowing from the opening of the dispenser;

moving the dispenser relative to the leads in a direction from one lead to another so that the distance is kept constant; and applying the adhesive to a predetermined portion of the leads, respectively.

According to the second feature of the invention, a method of making a semiconductor device having a semiconductor chip, comprises the steps of:

preparing a lead frame having a plurality of leads, positioning an opening of a dispenser against one of the leads at a predetermined distance;

keeping the adhesive flowing from the opening of the dispenser;

moving the dispenser relative to the leads in a direction from one lead to another so that the distance is kept constant;

applying the adhesive to a predetermined portion of the leads, respectively;

mounting the semiconductor chip on the leads through the adhesive;

electrically connecting the leads to corresponding terminals formed on the semiconductor chip, respectively; and packaging the leads and the semiconductor chip.

BRIEF DESCRIPTION OF THE DRAWING

The invention will be explained in more detail in conjunction with the appended drawings, wherein.

DESCRIPTION OF THE PREFERRED EMBODIMENTS

Before explaining a method of applying adheseves to leads of a lead frame in the first preferred embodiment, the aforementioned conventional connecting structures will be explained in FIGS. 1, 2 and 3.

Figure 1:
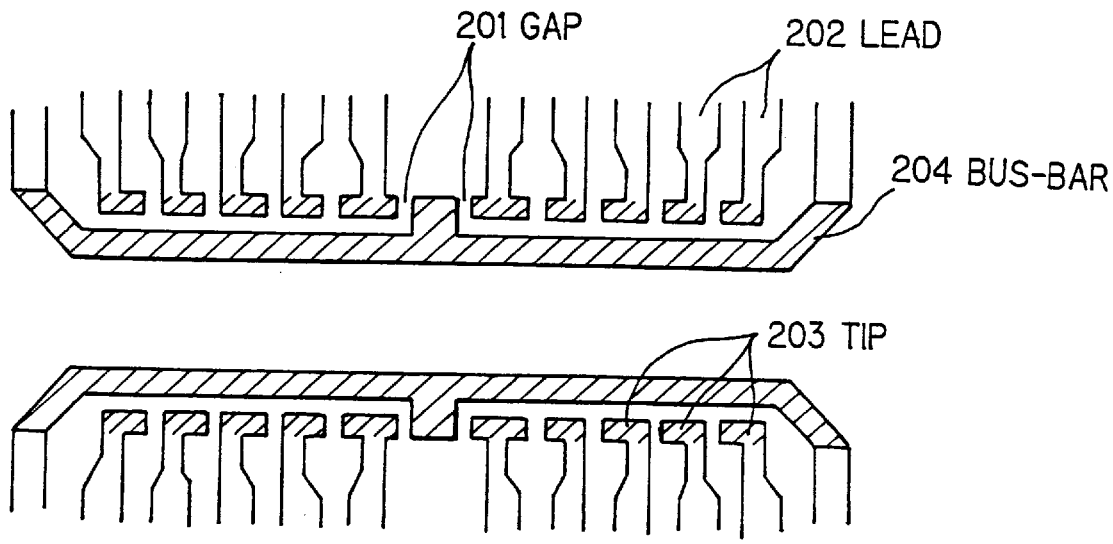
FIG. 1 is a plane view showing a lead structure of a conventional lead frame.
Figure 2:
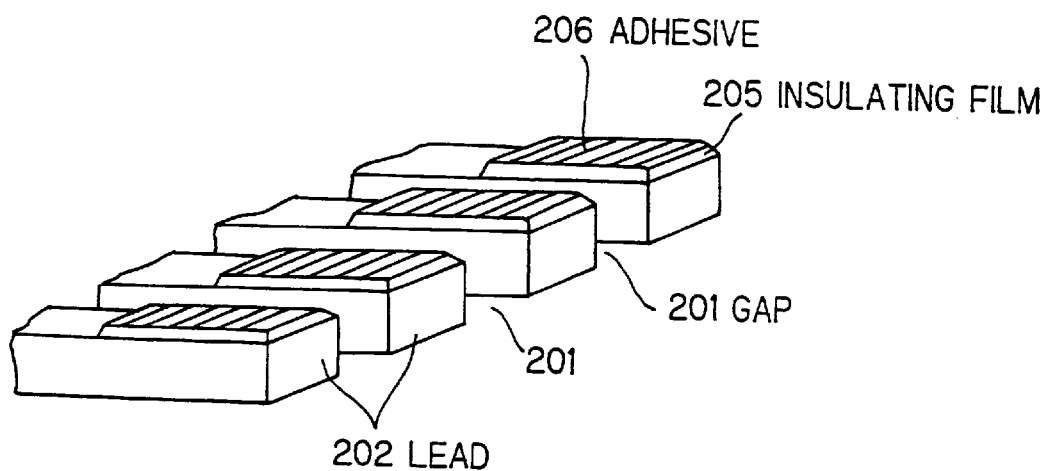
FIG. 2 is a perspective view showing a first conventional method of attaching insulating films to leads of a lead frame.

FIG. 1 shows a lead structure of a conventional lead frame, which comprises leads 202 disposed with a predetermined gap 201 from each other, each lead having a tip 203, and a bus-bar 204 disposed parallel along the tips 203 of the leads 202. In order to attach a semiconductor chip to the leads 202 of the lead frame, an insulating film(s) like a polyimide film(s) is stuck to a predetermined portion (hatched portion in FIG. 1) of the lead 202 and the bus-bar 204 through adhesives applied to both sides of the insulating film(s). As shown in FIG. 2, insulating films 205, on both sides of which adhesive layers 206 are provided, may be cut or punched out in a predetermined shape, and stuck to each lead 202 of the lead frame.

In the first conventional method of sticking an insulating film to leads of a lead frame, however, as explained before, there is a disadvantage in that a fabrication cost becomes high, because of a necessity of a larger amount of expensive polyimide films. Moreover, if the leads and the semiconductor chip are packaged by a resin to obtain a semiconductor device, there is another disadvantage in that the polyimide films may cause a crack into the package of the semiconductor device, because of an expansion of the polyimide films caused by moisture absorption.

Figure 3:
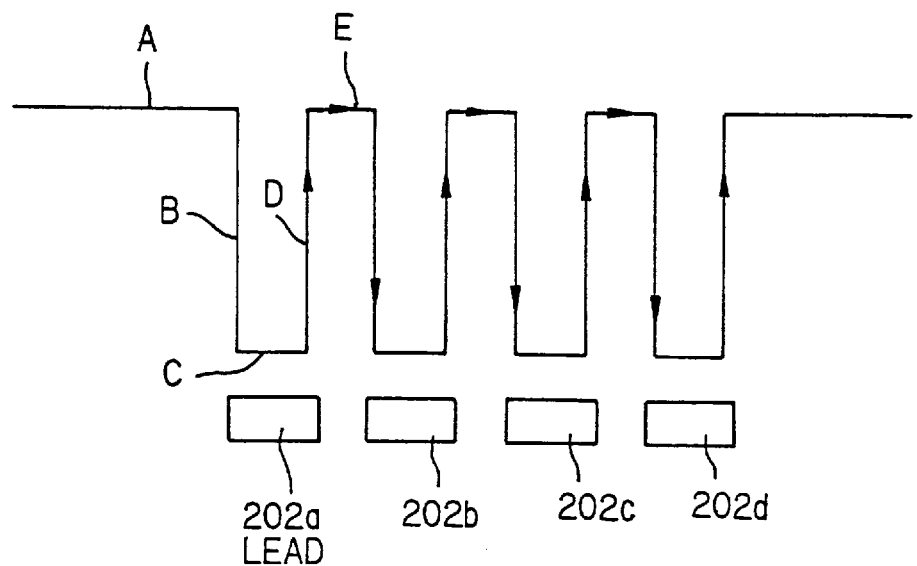
FIG. 3 is an explanatory view showing a second conventional method of applying adhesives to leads of a lead frame by point-to-point process.

FIG. 3 shows a second conventional method of applying adhesives to leads of a lead frame, which has been proposed in order to avoid such disadvantages. In the second conventional method, using point-to-point applying process, an X-Y robot (not shown) can move a dispenser (not shown) in both X and Y directions so that adhesives are applied to predetermined portions of the leads 202a, 202b, 202c and 202d of the lead frame. In FIG. 3, a solid line shows a track of a nozzle (not shown) of the dispenser (not shown) moved by the X-Y robot (not shown). The second conventional method comprises the steps of moving a nozzle (not shown) of the dispenser (not shown) horizontally so that the nozzle thereof is above one lead 202a of the lead frame (track A), lowering the nozzle (track B), halting at a predetermined distance from the surface of the lead 202a, flowing an adhesive from the nozzle for a predetermined time, applying the adhesive to the leads of the lead frame (track C), raising the nozzle of the dispenser at a predetermined distance (track D), and moving the nozzle of the dispenser horizontally to the next lead (track E). After that, the lowering (track B), flowing, applying (track C), raising (track D) and moving (track E) processes are repeated so that adhesives are applied to leads 202b, 202c and 202d in order, respectively.

In the second conventional method of applying adhesives to leads of a lead frame, however, as mentioned before, there is a disadvantage in that it takes about ten times as long as it takes in the first conventional method of sticking an insulating film to leads of a lead frame, because at each time the adhesives are applied to each lead of the lead frame, the nozzle of the dispenser needs to be lowered, raised and moved horizontally.

Figure 4:
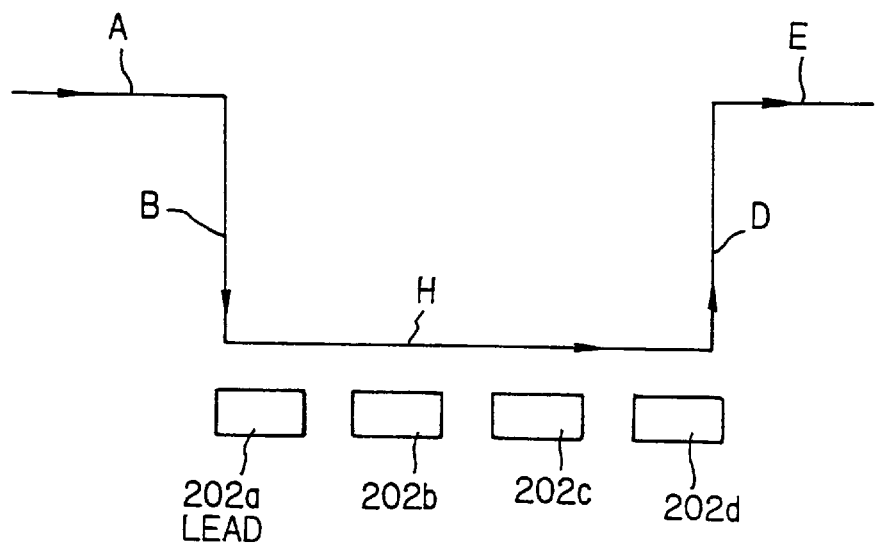
FIG. 4 is an explanatory view showing a preferred embodiment of applying adhesives to leads of a lead frame according to the invention.

Next, a method of applying adhesives to leads of a lead frame in the preferred embodiment will be explained in FIG. 4, wherein like parts are indicated by like reference numerals and characters as used in FIG. 3. In the preferred embodiment, a nozzle (not shown) of a dispenser (not shown) is moved horizontally above one lead 202a (track A), and positioned against the lead 202a at a predetermined distance (track B). While keeping adhesives (not shown) flowing from the nozzle of the dispenser, the dispenser is moved horizontally relative to the leads 202a, 202b, 202c and 202d in a distance from the lead 202a to the next lead 202b so that the distance is kept constant (track H). Then the adhesives are applied to a predetermined portion of each lead 202a, 202b, 202c and 202d. When the application of adhesives to the last lead 202d is complete, the nozzle (not shown) is raised (track D) and moved horizontally (track E). According to the preferred embodiment, the number of upward and downward movements of the nozzle against leads is greatly reduced proportionally to the number of lead, therefore, the application time can be shortened.

Figure 5:
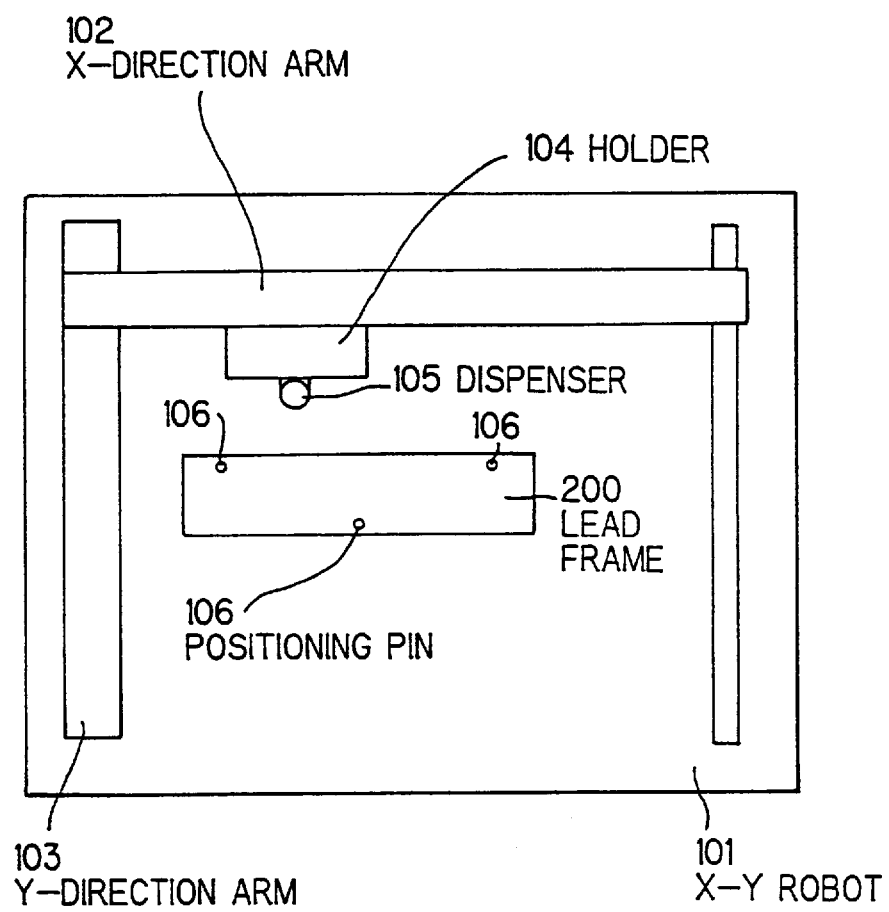
FIG. 5 is a plane view showing an apparatus for implementing the method of applying adhesives to leads of a lead frame according to the invention.
Figure 6:
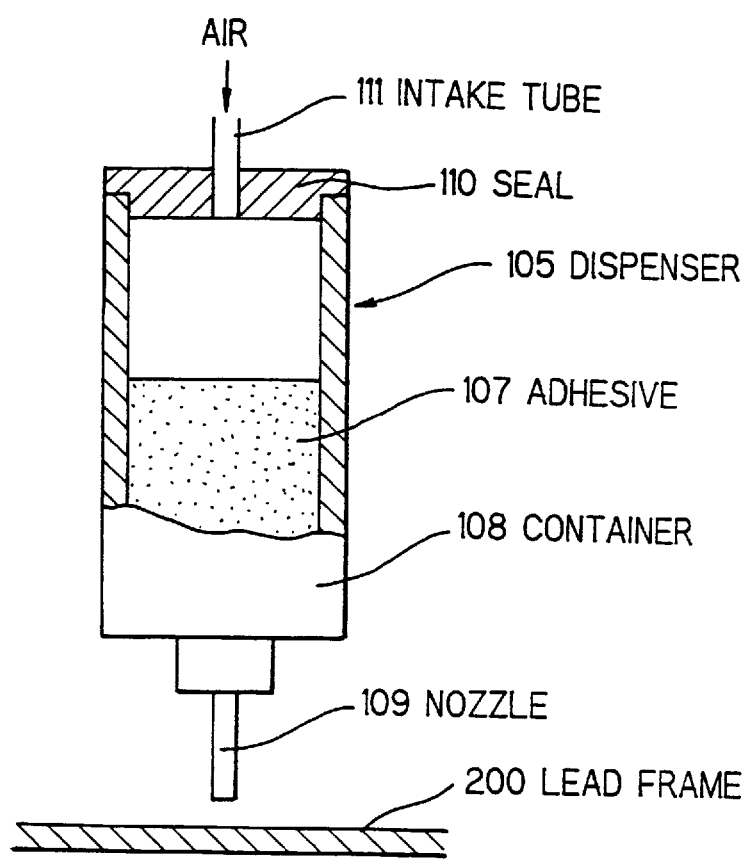
FIG. 6 is a cross-sectional view showing a dispenser having a nozzle used in the preferred embodiment according to the invention.

FIG. 5 shows an apparatus used for implementing the preferred embodiment according to the invention, and FIG. 6 shows a dispenser used in FIG. 5. As shown in FIG. 5, the apparatus comprises an X-Y robot 101 and an X-direction arm 102 and a Y-direction arm 103, one of which is perpendicular to another, a dispenser 105 attached to the X-direction arm 102 by a holder 104. According to such a mechanism, the dispenser 105 can be moved horizontally. A certain length of a lead frame 200 is placed in the center of the area enclosed by the X-direction arm 102 and the Y-direction arm 103, and precisely positioned by positioning pins 106. The dispenser 105, as shown in FIG. 6, comprises a container 108 having a cylindrical shape for containing adhesive 107, a nozzle 109 attached to a lower end of the container 108, a seal 110 attached to an upper end of the container 108, and an intake tube 111, one end of which is attached to the seal 110. A compressed air is guided to the container 108 to pressurize the adhesive 107, then the adhesive 107 flow from the nozzle 109.

In operation, first, the lead frame 200 is carried in and placed at a predetermined position by the positioning pins 106. After that, the dispenser 105 is moved horizontally from its home position to a predetermined place above the lead frame 200 (preferably above one lead 202a of the lead frame, see FIG. 4). Then the dispenser 105 is lowered down to a predetermined distance between the tip portion of the nozzle 109 and the surface of the lead frame 200. While keeping the distance constant, the adhesive 107 flows from the nozzle 109 by pressurizing the adhesive 107 by the compressed air, and are being applied to the lead 202a of the lead frame 200. Next, keeping the adhesives 107 flowing (i.e. continuously flowing the adhesive 107) from the nozzle 109, the dispenser is moved horizontally by driving the X-direction arm to the next position, where the adhesive is applied to the next lead 202b. In the same manner, the adhesives are applied to other leads 202c, and 202d without moving the dispenser upward and downward.

In the preferred embodiment, if leads 202 of the lead frame 200 are arranged in a straight line as shown in FIG. 1, the movement of the dispenser may be rectilinear by driving only the X-direction arm 102. However, if they are arranged in an irregular profile, such that shorter and longer leads are arranged alternately. In such a case, not only the X-direction arm 102 but also the Y-direction arm 103 are driven to move the dispenser in X-Y directions.

In the embodiment, the dispenser is moved in X-Y directions, however, the lead frame itself may be moved instead.

Using the apparatus shown in FIGS. 5 and 6, experiments of applying adhesives to leads of a lead frame according to the invention have been carried out by the inventors. A lead frame having leads of 0.3 mm wide is used. A gap between leads is 0.3 mm. Thermoplastic polyimide group adhesives are applied to the leads by a nozzle having an inside diameter of 0.1~0.3 mm. The distance between the tip of the nozzle and the surface of the lead is determine within 0.1~0.2 mm so that the distance is to be one-fourth to three times as long as the inside diameter of the nozzle. Though the adhesives are applied to the leads of the lead frame with the adhesive kept flowing from the horizontally moving nozzle (at 3~5 mm/sec), no fall of adhesives into the gaps is observed. Moreover, it is found that adhesives are applied from 10~20 times as fast as in the conventional point-to-point applying method. This speed is equivalent to or faster than that in the conventional method of sticking an insulating film to leads of a lead frame.

In the embodiment, appropriate applying conditions depend on a viscosity of adhesive, the inside diameter of a nozzle (the size of the opening) of the dispenser, and the distance between the tip of the nozzle and the surface of the lead as well as in the conventional point-to-point applying method. Therefore, at a certain condition, adhesive may fall into the gap between leads. One of the most significant factors to obtain an appropriate result of adhesive-application is the distance between the tip of the nozzle (opening) of dispenser and the surface of the lead. The higher the viscosity becomes, the bigger the inside diameter of the nozzle becomes, and the higher the flowing pressure of the adhesive becomes. According to a result of experiments carried out by the inventors, the appropriate distance is to be one-fourth to three times as long as the inside diameter of the nozzle.

Figure 7A:
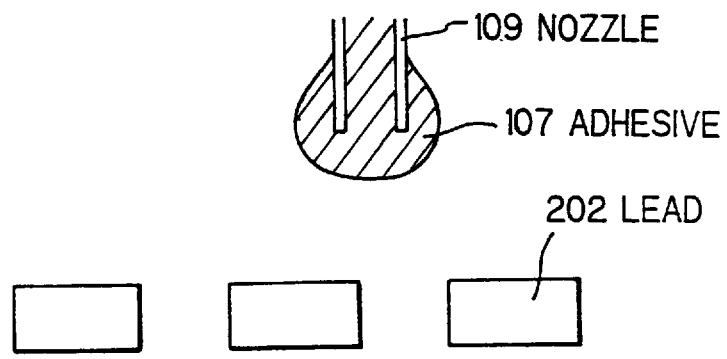
FIGS. 7A, 7B and 7C are explanatory views showing applying conditions of adhesives to leads of a lead frame depending on the distance between the tip of a nozzle of a dispenser and a surface of each lead in the invention.
Figure 7B:
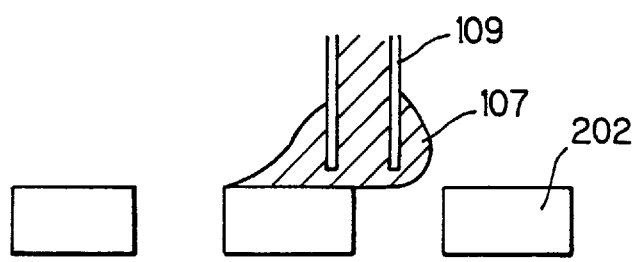
Figure 7C:
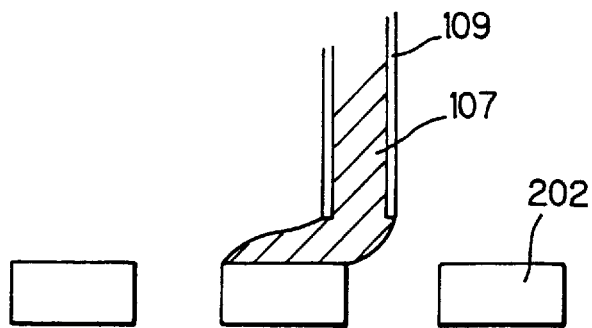

FIGS. 7A, 7B and 7C show applying conditions of an adhesive 107 to a lead 202 of a lead frame depending on the distance between the tip of the nozzle 109 of a dispenser (not shown) and a surface of each lead 202 in the invention. If the distance is more than three times as long as the inside diameter of the nozzle 109, the adhesive flowing from the nozzle may significantly climb up the outside surface of the nozzle 109 by the surface tension between them earlier than being applied to the lead 202, as shown in FIG. 7A. On the other hand, if the distance is less than one-fourth as long as the inside diameter of the nozzle 109, although the adhesive is applied to the surface of the lead 202, the same phenomenon may occur, as shown in FIG. 7B. Furthermore, if the distance is appropriate, a good result of adhesive-application is obtained and the adhesive is prevented from falling into the gap between the leads as well, as shown in FIG. 7C.

Although the invention has been described with respect to specific embodiment for complete and clear disclosure, the appended claims are not to be thus limited but are to be construed as embodying all modification and alternative constructions that may be occur to one skilled in the art which fairly fall within the basic teaching here is set forth.

What is claimed is:

1. A method of applying an adhesive to a plurality of leads of a lead frame, comprising the steps of:

positioning an opening of a dispenser against one of said leads at a distance determined by the inner diameter of said opening;

keeping said adhesive flowing from said opening of said dispenser;

moving said dispenser relative to said leads in a direction from one lead to another so that said distance is kept constant; and applying said adhesive to a portion of said leads to which a semiconductor chip is to be fixed, respectively.

2. A method of applying an adhesive to a plurality of leads of a lead frame, according to claim 1, wherein:

said opening of said dispenser is a nozzle having an inside diameter; and said distance is one-fourth to three times as long as said inside diameter.

3. A method of applying an adhesive to a plurality of leads of a lead frame, according to claim 1, wherein:

said dispenser is moved horizontally by X-Y rectilinear mechanism.

4. A method of making a semiconductor device having a semiconductor chip, comprising the steps of:

preparing a lead frame having a plurality of leads, positioning an opening of a dispenser against one of said leads at a distance determined by the inner diameter of said opening;

keeping said adhesive flowing from said opening of said dispenser;

moving said dispenser relative to said leads in a direction from one lead to another so that said distance is kept constant;

applying said adhesive to a portion of said leads to which a semiconductor chip is to be fixed, respectively;

mounting said semiconductor chip on said leads through said adhesive;

electrically connecting said leads to corresponding terminals formed on said semiconductor chip, respectively; and packaging said leads and said semiconductor chip.

5. A method of making a semiconductor device having a semiconductor chip, according to claim 4, wherein;

said opening of said dispenser is a nozzle having an inside diameter; and said distance is one-fourth to three times as long as said diameter.

6. A method of making a semiconductor device having a semiconductor chip, according to claim 4, wherein:

said dispenser is moved horizontally by X-Y rectilinear mechanism.

* * * * *